(12) United States Patent
Zhang et al.

(10) Patent No.: US 12,260,042 B2
(45) Date of Patent: *Mar. 25, 2025

(54) DISPLAY PANEL, DISPLAY DEVICE AND METHOD FOR FABRICATING THE DISPLAY PANEL

(71) Applicants: Chengdu BOE Optoelectronics Technology Co., Ltd., Sichuan (CN); BOE TECHNOLOGY GROUP CO., LTD., Beijing (CN)

(72) Inventors: Yuanqi Zhang, Beijing (CN); Ping Wen, Beijing (CN); Shun Zhang, Beijing (CN); Yang Zeng, Beijing (CN); Wei Wang, Beijing (CN); Yu Wang, Beijing (CN); Chang Luo, Beijing (CN); Yi Zhang, Beijing (CN)

(73) Assignees: Chengdu BOE Optoelectronics Technology Co., Ltd., Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

This patent is subject to a terminal disclaimer.

(21) Appl. No.: 18/488,295

(22) Filed: Oct. 17, 2023

(65) Prior Publication Data
US 2024/0045541 A1 Feb. 8, 2024

Related U.S. Application Data

(63) Continuation of application No. 17/904,968, filed as application No. PCT/CN2021/125885 on Oct. 22, 2021, now Pat. No. 11,893,178.

(30) Foreign Application Priority Data

Dec. 25, 2020 (CN) .......................... 202011558822.3

(51) Int. Cl.
G06F 3/041 (2006.01)
G06F 3/044 (2006.01)
G09F 9/30 (2006.01)

(52) U.S. Cl.
CPC ........ *G06F 3/04164* (2019.05); *G06F 3/0412* (2013.01); *G06F 3/0443* (2019.05);
(Continued)

(58) Field of Classification Search
None
See application file for complete search history.

(56) References Cited

U.S. PATENT DOCUMENTS

2010/0309160 A1 12/2010 Lin
2018/0129330 A1* 5/2018 Ding ..................... G06F 3/0443
(Continued)

FOREIGN PATENT DOCUMENTS

CN 108681415 A 10/2018
CN 108695343 A 10/2018
(Continued)

OTHER PUBLICATIONS

International Search Report and Written Opinion for PCT/CN2021/094371 mailed Jul. 1, 2021 with translation, 14 pages.
(Continued)

*Primary Examiner* — Duane N Taylor, Jr.
(74) *Attorney, Agent, or Firm* — Myers Bigel, P.A.

(57) ABSTRACT

Embodiments of this disclosure disclose a display panel and a display device including the display panel. The display panel includes: a base substrate, the base substrate including a display area and a non-display area around the display area; a touch electrode layer on the base substrate, the touch electrode layer being within the display area of the base substrate; and a plurality of signal lines electrically connected with the touch electrode layer, the plurality of signal
(Continued)

lines being distributed within a first area of the non-display area. The display panel further includes at least one outer dummy trace within a second area of the non-display area, the second area is between the first area and an outer border of the non-display area, and the at least one outer dummy trace and the plurality of signal lines are separated from each other.

17 Claims, 6 Drawing Sheets

(52) U.S. Cl.
CPC .............. *G06F 3/0446* (2019.05); *G09F 9/30* (2013.01); *G09G 2300/0413* (2013.01)

(56) References Cited

U.S. PATENT DOCUMENTS

| | | | |
|---|---|---|---|
| 2021/0083013 A1* | 3/2021 | Bang | ...................... H10K 50/84 |
| 2021/0193754 A1 | 6/2021 | Han et al. | |

FOREIGN PATENT DOCUMENTS

| | | | | |
|---|---|---|---|---|
| CN | 110045874 | A | | 7/2019 |
| CN | 110244873 | A | | 9/2019 |
| CN | 110308815 | A | * | 10/2019 ......... G02F 1/13338 |
| CN | 110489009 | A | | 11/2019 |
| CN | 110658952 | A | | 1/2020 |
| CN | 111007954 | A | | 4/2020 |
| CN | 210377421 | U | | 4/2020 |
| CN | 210429887 | U | | 4/2020 |
| CN | 210534754 | U | | 5/2020 |
| CN | 111708458 | A | | 9/2020 |
| CN | 112612371 | A | | 4/2021 |
| CN | 214098387 | U | | 8/2021 |
| KR | 20170079570 | A | | 7/2017 |

OTHER PUBLICATIONS

International Search Report and Written Opinion for PCT/CN2021/125885 mailed Dec. 23, 2021, with translation of the International Search Report, 11 pages.
Notice of Allowance for U.S. Appl. No. 17/753,944 mailed Jun. 7, 2023, 9 pages.
Notice of Allowance for U.S. Appl. No. 17/904,968, mailed Aug. 18, 2023, 7 pages.
Novelty Report with translation, dated Feb. 24, 2021, 13 pages.
Novelty Report with translation, dated Sep. 25, 2020, 9 pages.
Office Action for U.S. Appl. No. 17/904,968 mailed Jun. 1, 2023, 10 pages.
Second Notice of Allowance for U.S. Appl. No. 17/753,944 mailed Sep. 18, 2023, 12 pages.

* cited by examiner

DISPLAY PANEL, DISPLAY DEVICE AND METHOD FOR FABRICATING THE DISPLAY PANEL

CROSS REFERENCE TO RELATED APPLICATION(S)

The present application is a continuation application based on U.S. patent application Ser. No. 17/904,968, which claims the priority of the Chinese patent application No. 202011558822.3 filed on Dec. 25, 2020, the entire disclosure of which is incorporated herein by reference.

TECHNICAL FIELD

This disclosure relates to the field of display technologies, and in particular to a display panel, a display device comprising the display panel and a method for fabricating the display panel.

BACKGROUND

At present, touch technology has been widely applied to various types of display devices, such as OLED touch display devices and LCD touch display devices, greatly improving user's experience for the display devices. A display device involving touch technology usually comprises a touch IC chip (also called a touch controller) for transmitting a control signal to a touch electrode in the display device and/or receiving a sensing signal from the touch electrode so as to determine a touch position of the user. However, for the existing touch display devices, there is still much room for improvement in the touch performance.

SUMMARY

An embodiment of this disclosure provides a display panel, comprising: a base substrate, the base substrate comprising a display area and a non-display area around the display area; a touch electrode layer on the base substrate, the touch electrode layer being within the display area; and a plurality of signal lines electrically connected with the touch electrode layer, the plurality of signal lines being distributed within a first area of the non-display area. The display panel further comprises at least one outer dummy trace located within a second area of the non-display area, the second area being between the first area and an outer border of the non-display area. The at least one outer dummy trace and the plurality of signal lines are separated from each other.

According to some embodiments of the disclosure, the display panel further comprises a first signal shield line and a second signal shield line within the non-display area, at least part of the first signal shield line is between the second area and an outer border of the non-display area, and the second signal shield line is between the first signal shield line and the first area, the at least one outer dummy trace comprise at least one first dummy trace located between the first signal shield line and the second signal shield line.

According to some embodiments of the disclosure, the display panel further comprises a first signal shield line within the non-display area, at least part of the first signal shield line is between the second area and an outer border of the non-display area, and the at least one outer dummy trace comprises at least one first dummy trace located between the first signal shield line and the plurality of signal lines.

According to some embodiments of the disclosure, the display panel further comprises a second signal shield line within the non-display area, the second signal shield line is between the first area and the second area, the at least one outer dummy trace comprises at least one first dummy trace at a side of the second signal shield line facing away from the display area.

According to some embodiments of the disclosure, the first signal shield line comprises a grounded wire, and the second signal shield line is configured to receive a fixed potential or a square wave signal.

According to some embodiments of the disclosure, the touch electrode layer comprises a plurality of first touch electrodes arranged in parallel and a plurality of second touch electrodes arranged in parallel, the plurality of first touch electrodes and the plurality of second touch electrodes intersect each other, wherein the plurality of signal lines comprise a plurality of first signal lines each connected with a corresponding first touch electrode and a plurality of second signal lines each connected with a corresponding second touch electrode.

According to some embodiments of the disclosure, a pitch between the first segment and the outermost first signal line equals a pitch between the outermost first signal line and an adjacent first signal line, and a pitch between the second segment and the outermost second signal line equals a pitch between the outermost second signal line and an adjacent second signal line.

According to some embodiments of the disclosure, the base substrate comprises a bending area within the non-display area, and the base substrate forms a first part and a second part via the bending area, the first part comprises the display area, the first area and the second area, and the at least one outer dummy trace further comprises at least one second dummy trace located within the second area and adjacent to the bending area.

According to some embodiments of the disclosure, the plurality of signal lines, the first signal shield line and the second signal shield line extend to the bending area, and the at least one second dummy trace is distributed between the first signal shield line and an outer border of the non-display area.

According to some embodiments of the disclosure, the display panel further comprises at least one middle dummy trace between at least part of the plurality of signal lines, the at least one middle dummy trace and the plurality of signal lines are separated from each other.

According to some embodiments of the disclosure, the touch electrode layer comprises a plurality of first touch electrodes arranged in parallel and a plurality of second touch electrodes arranged in parallel, the plurality of first touch electrodes and the plurality of second touch electrodes intersect each other, wherein the plurality of signal lines comprise a plurality of first signal lines each connected with a corresponding first touch electrode and a plurality of second signal lines each connected with a corresponding second touch electrode, the base substrate comprises a bending area within the non-display area, and the base substrate forms a first part and a second part via the bending area, wherein the first part comprises the display area and a middle non-display area of the non-display area between the bending area and the display area, the plurality of first signal lines and the plurality of second signal lines extend to the middle non-display area, and the at least one middle dummy trace comprises at least one third dummy trace located between the plurality of first signal lines and the plurality of second signal lines and within the middle non-display area.

According to some embodiments of the disclosure, the display panel further comprises a touch controller arranged on the second part of the base substrate, and the plurality of signal lines are electrically connected to the touch controller.

According to some embodiments of the disclosure, the at least one first dummy trace is spaced apart from each other and distributed evenly between the first signal shield line and the second signal shield line, and the at least one second dummy trace is spaced apart from each other and distributed evenly between the first signal shield line and an outer border of the non-display area.

According to some embodiments of the disclosure, at least one of the outer dummy trace, the signal line and the middle dummy trace comprises a first metal wire and a second metal wire above the first metal wire, and the display panel further comprises an insulating layer between the first metal wire and the second metal wire, the insulating layer comprises a via hole, and the first metal wire is electrically connected to the second metal wire through the via hole in the insulating layer.

According to some embodiments of the disclosure, a material of the first metal wire and the second metal wire comprises at least one selected from a group consisting of titanium, silver and indium tin oxide.

According to some embodiments of the disclosure, the display panel further comprises an encapsulation dam on the base substrate, the encapsulation dam is between the first signal shield line and an outer border of the non-display area, the encapsulation dam extends within the non-display area around the first signal shield line, and a first distance is maintained between the encapsulation dam and the first signal shield line, and a second distance is maintained between the first signal shield line and an outer dummy trace adjacent to the first signal shield line among the at least one outer dummy trace, a ratio of the first distance to the second distance is greater than 1 and smaller than 6.

According to some embodiments of the disclosure, an average width of signal lines remoter from the display area is greater than an average width of signal lines closer to the display area among the plurality of signal lines.

According to some embodiments of the disclosure, the display panel further comprises at least one crack detection line on the base substrate, the at least one crack detection line is between an outer border of the non-display area and the first signal shield line, and an extension pattern of the at least one crack detection line is consistent with an extension pattern of the first signal shield line.

According to some embodiments of the disclosure, a third distance is maintained between the at least one crack detection line and the first signal shield line, wherein the second distance between the first signal shield line and an outer dummy trace adjacent to the first signal shield line among the at least one outer dummy trace is two to three times the third distance.

According to some embodiments of the disclosure, the display panel further comprises a pixel structure layer between the touch electrode layer and the base substrate, and the pixel structure layer comprises an anode, a cathode and an organic light-emitting layer therebetween.

Another embodiment of this disclosure provides a display device comprising the display panel according to any one of the embodiments discussed above.

By arranging in the non-display area of the display panel the outer dummy traces, the middle dummy traces, or both of the dummy traces as described in the embodiments of this disclosure, it is possible to facilitate the etching uniformity of the etching process for the metal film layer during the fabrication of the display panel, thereby helping to improve the touch performance of the fabricated display panel or display device.

DETAILED DESCRIPTION OF EMBODIMENTS

Some embodiments of this disclosure will be explained in detail by specific examples below. It should be understood that the exemplary embodiments described below are only implementations for explaining and expounding some embodiments of this disclosure, rather than real structures of the display panel or display device. In particular, the various lines shown in each figure do not represent specific patterns of lines in an actual product. Instead, they only schematically show positions of the lines and relative position relationships with respect to other lines or regions of the display panel. Moreover, based on the embodiments described herein and principles revealed by these embodiments, those skilled in the art can implement the technical solution of this disclosure by other different implementations to obtain further embodiments different from the embodiments described herein, and the further embodiments also fall within the protection scope of the patent application. Therefore, the exemplary embodiments described herein do not limit the protection scope of the patent application.

In a non-display area of a touch display device, there are usually some metal wires that electrically connect a touch controller with touch electrodes in the touch display device. The metal wires are led out from terminals of the touch controller and extend to a touch electrode layer via the non-display area of the display device to connect to respective touch electrodes. It has been found by inventors of the application that the process of fabricating the metal wires often leads to a reduced touch performance of the display device. Specifically, the metal wires on the periphery of the display area of the display device are not evenly distributed in the non-display area. For example, for a display device having a rectangular display area, the metal wires may be distributed outside two or three of the four edges of the display area with one edge of the display area having no metal wires on its periphery, or part of the non-display area surrounding the rectangular display area is a blank area having no metal wires. The inventors have realized that etching uniformity can hardly be ensured for the metal film layer during the fabrication of the metal wires of the non-display area, and non-uniform etching of the metal film layer is a factor affecting the touch performance of the display device.

Figure 1:
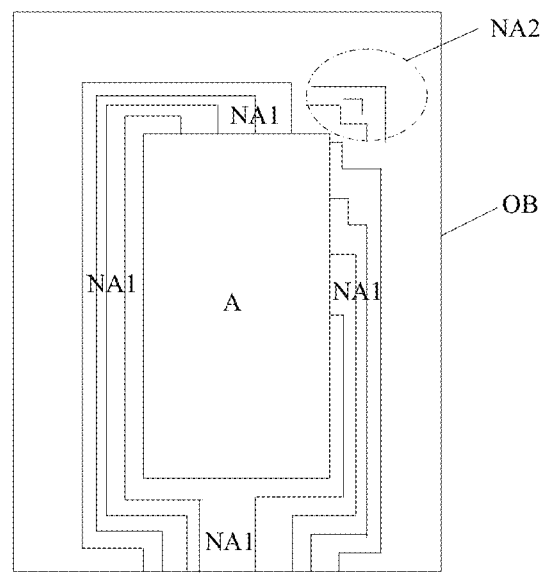
FIG. 1 schematically shows the distribution of the signal lines and the outer dummy traces in the display panel according to an embodiment of this disclosure.

In light of the above technical insight, an embodiment of this disclosure provides a display panel to facilitate improvement of the touch performance of the touch display device. The display panel according to the embodiment of this disclosure comprises a base substrate, a touch electrode layer, a plurality of signal lines and at least one outer dummy trace. As shown in FIG. 1, the base substrate of the display panel comprises a display area A and a non-display area (e.g., NA1, NA2 shown in FIG. 1) around the display area A, and the touch electrode layer is arranged on the base substrate and located within the display area A. The display panel further comprises a plurality of signal lines and at least one outer dummy trace, and the plurality of signal lines are electrically connected with the touch electrode layer and distributed within a first area NA1 of the non-display area, the first area NA1 being adjacent to the display area A. The at least one outer dummy trace is located within a second area NA2 of the non-display area, and the second area NA2 lies between the first area NA1 and an outer border OB of the non-display area. Besides, as shown in FIG. 1, the outer dummy traces within the second area NA2 and the signal lines within the first area NA1 are separated from each other.

The "dummy traces" (including "outer dummy traces" mentioned in the above embodiment and "first dummy trace", "second dummy trace", "middle dummy trace" and "third dummy trace" that will be mentioned below) herein refer to lines that do not transmit signals during operation of the display panel or display device, and these dummy traces may not be connected with any other electrical elements in the display panel or display device and do not receive any electric signals during operation of the display panel or display device. Alternatively, some or all of these dummy traces are only electrically connected with a fixed potential (e.g., a ground potential). In addition, the plurality of dummy traces independent of each other may present any kind of patterns, and the pattern of each dummy trace and the overall pattern of the plurality of dummy traces are not limited at all in the embodiments of this disclosure.

The "outer dummy traces" mentioned in the above embodiment are called with respect to "middle dummy traces" that will be described in other embodiments below, and are intended to discriminate the dummy traces in terms of position rather than to limit any attribute or feature (e.g., structure, pattern, material) of the dummy traces in any sense. As described in the above embodiments, the second area where the outer dummy traces are located is between the first area where the signal lines within the non-display area are located and an outer border of the non-display area, and the middle dummy traces are arranged among the signal lines, which will be specifically described below in a further embodiment.

Figure 2:
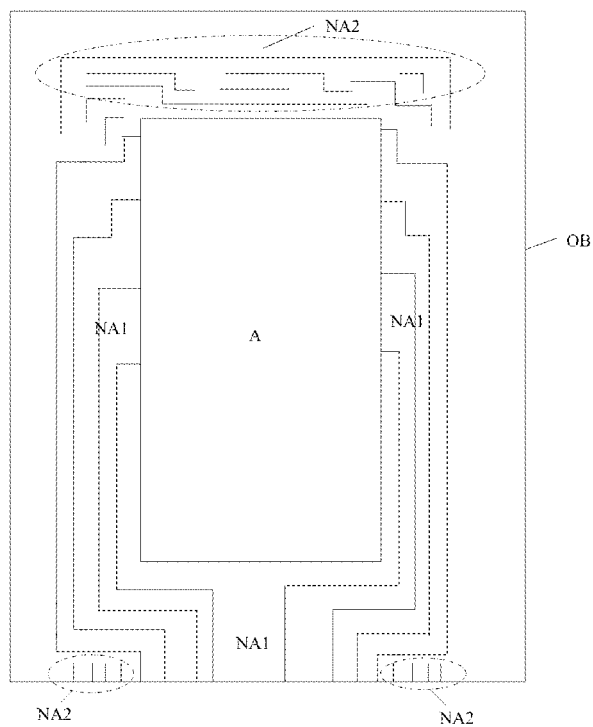
FIG. 2 schematically shows the distribution of the signal lines and the outer dummy traces in the display panel according to another embodiment of this disclosure.

FIG. 1 shows an example in which the outer dummy traces are arranged in a corner region between the outer border OB of the non-display area and the first area NA1 where the plurality of signal lines are located, and FIG. 2 schematically shows another example of the arrangement of the outer dummy traces. As shown in FIG. 2, there are three second areas NA2 between the first area NA1 of the non-display area and the outer border OB of the non-display area, one second area NA2 is above the display area A, and the other two second areas NA2 are below the display area A. According to some embodiments of this disclosure, the first area NA1 and the second area NA2 may together form a circular area surrounding the display area A.

The procedure of forming signal lines within the non-display area usually involves an etching process for a metal film layer, and for the display panel provided in the embodiments of this disclosure, while the signal lines of the non-display area are fabricated, a plurality of outer dummy traces may also be fabricated at the same time. The outer dummy traces, together with the signal lines, make the materials of the final resultant metal wires distributed more evenly on the periphery of the display area, and accordingly, during the fabrication of the signal lines and the outer dummy traces, the etching uniformity of the metal film layer is improved, which helps to improve the touch performance of the display panel or display device. The materials for fabricating the signal lines and the outer dummy traces are not limited in the embodiments of this disclosure, and the materials for fabricating the signal lines and the outer dummy traces may be any metal, metal oxide or metal alloy material that is electrically conductive, including but not limited to, for instance, indium tin oxide (ITO), silver (Ag), aluminum (Al), titanium (Ti), etc.

Figure 3:
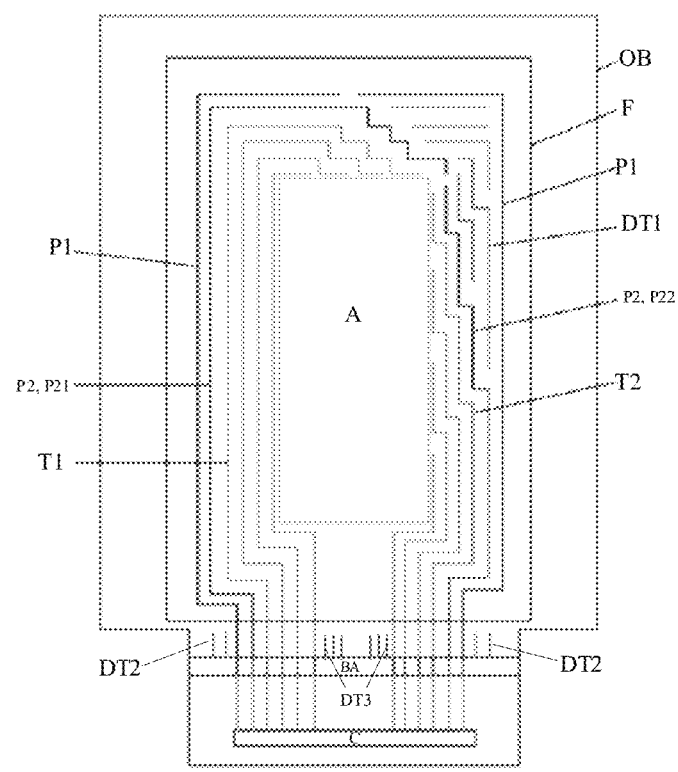
FIG. 3 schematically shows the distribution of the signal shield lines, the signal lines and the outer dummy traces in the display panel according to another embodiment of this disclosure.

According to some embodiments of this disclosure, signal shield lines are arranged within the non-display area of the display panel so as to reduce external signal interference to the signal lines. As shown in FIG. 3, the display panel comprises a first signal shield line P1 and a second signal shield line P2 located in the non-display area, and at least part of the first signal shield line P1 lies between the second area NA2 (provided with first outer dummy traces DT1) and the outer border OB of the non-display area, and the second signal shield line P2 lies between the first signal shield line P1 and the first area (provided with signal lines T1 and T2). According to some embodiments of this disclosure, the at least one outer dummy trace arranged in the non-display area comprises at least one first dummy trace DT1 between the first signal shield line P1 and the second signal shield line P2. In the embodiment of FIG. 3, the first signal shield line P1 and the second signal shield line P2 substantially extend around the display area A, and each of the first signal shield line P1 and the second signal shield line P2 may be either an uninterrupted continuous wire, or arranged to comprise several segments separated from each other.

According to some embodiments of this disclosure, the first signal shield line P1 may comprise a grounded wire, and the second signal shield line P2 may be configured to receive a fixed potential or a square wave signal. As shown in FIG. 3, the second signal shield line P2 extends along an outer edge of the first area NA1 where the signal lines are located, and the first signal line P1 substantially surrounds the second signal shield line P2, thereby doubling the signal shield for the signal lines T1 and T2 within the first area. As shown in FIG. 3, by forming a plurality of first dummy traces DT1 in large gap areas between the first signal shield line P1 and the second signal shield line P2, it is possible to achieve uniformity of the etching for the metal film layer during the fabrication of the signal lines, the first signal shield line P1 and the second signal shield line P2, thereby helping to improve the touch performance of the final touch display panel or display device.

In some embodiments, the display panel further comprises a first signal shield line P1 within the non-display area, at least part of the first signal shield line P1 is between the second area NA2 and an outer border OB of the non-display area, the at least one outer dummy trace comprises at least one first dummy trace DT1 located between the first signal shield line P1 and the plurality of signal lines T2.

In some embodiments, the display panel further comprises a second signal shield line P2 within the non-display area, the second signal shield line P2 is between the first area NA1 and the second area NA2, the at least one outer dummy trace comprises at least one first dummy trace DT1 at a side of the second signal shield line P2 facing away from the display area A.

Figure 4:
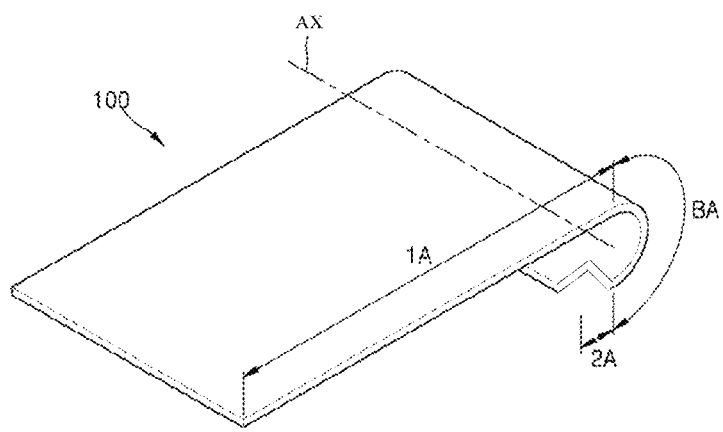
FIG. 4 schematically shows a state of the base substrate of FIG. 3 when it is bent.

With reference to FIG. 4 in combination with FIG. 3, according to some embodiments of this disclosure, the base substrate is a flexible base substrate, or the base substrate comprises a flexible region such that the base substrate is bendable. FIG. 4 schematically shows a bent base substrate 100, and FIG. 3 shows a state of the base substrate when it is not bent. The base substrate 100 comprises a bending area BA within the non-display area and forms a first part 1A and a second part 2A via the bending area BA, the first part 1A comprising the display area A, the first area NA1 and the second area NA2 of the non-display area, and the at least one outer dummy trace further comprises at least one second dummy trace DT2 located within the second area NA2 and adjacent to the bending area BA. "AX" in FIG. 4 indicates a bending axis of the bending area BA which may be parallel with a side of the base substrate, and the base substrate 100 may be bent around the bending axis AX such that the second part 2A is bent towards the back of the first part 1A, and the first part 1A and the second part 2A may form any angle therebetween, which will not be limited in any sense in the embodiments of this disclosure. In some embodiments, various IC devices including a touch controller C may be arranged in the second part 2A, and the IC devices can be thus concealed at the back of the first part 1A in a final resultant display device, thereby achieving full screen display. In this case, the plurality of signal lines are electrically connected to the touch controller C as shown in FIG. 3.

As shown in FIG. 3, in some embodiments, the plurality of signal lines T1, T2, the first signal shield line P1 and the second signal shield line P2 extend to the bending area BA, and the at least one outer dummy trace (the second dummy trace DT2) is respectively distributed between the first signal shield line P1 and the outer border OB of the non-display area. In the example of FIG. 3, the plurality of second dummy traces DT2 are between the display area A and the bending area BA. The plurality of second dummy traces DT2 herein can achieve a function similar to that of the first dummy traces DT1 in the above embodiments, i.e., it is possible to facilitate uniformity of the etching for the metal film layer during the fabrication of the signal lines, the first signal shield line P1 and the second signal shield line P2, thereby helping to improve the touch performance of the touch display panel or display device. Besides, since the region of the second dummy traces DT2 is close to the bending area BA, and meanwhile is located in a side edge area of the base substrate, the second dummy traces DT2 can also reduce the risk of the film layer in the side edge region of the display panel coming off the base substrate, thereby improving the structural stability of the display panel.

The signal lines T1 and the signal lines T2 mentioned in the embodiments of the disclosure represent signal lines connected with different touch electrodes in the touch electrode layer. For example, the signal lines T1 may be connected with a transmitting electrode in the touch electrode layer, and the signal lines T2 may be connected with a receiving electrode in the touch electrode layer, and the transmitting electrode and the receiving electrode can generate a mutual capacitance. During operation of the touch display device, the touch controller may transmit a control signal to the transmitting electrode and receive a sensing signal from the receiving electrode, and a touch position of the user can thus be determined based on a change in the mutual capacitance. Obviously, the touch electrodes in the touch electrode layer may also be of a structure based on a self-capacitance sensing principle, and the specific arrangement and structure of the touch electrodes in the touch electrode layer are not key points of this disclosure, which will not be detailed herein.

According to the embodiments of this disclosure, the plurality of first dummy traces are independent of each other, so are the plurality of second dummy traces, and they can be evenly distributed within corresponding areas of the non-display area, thereby further facilitating the uniformity of the etching for the metal film layer. As shown in FIG. 3, the first dummy traces DT1 are separated from each other and distributed evenly between the first signal shield line P1 and the second signal shield line P2, and the second dummy traces DT2 are separated from each other and distributed evenly between the first signal shield line P1 and the outer border OB of the non-display area. FIG. 3 further schematically shows an area F where an encapsulation dam on the base substrate is located. In this embodiment, the second dummy traces DT2 may be located between the bending area BA and the area F where the encapsulation dam is located.

In the embodiment of FIG. 3, a pitch between adjacent ones of the plurality of first dummy traces DT1 equals that between a second signal shield line P2 and a second signal line T2 closest to the second signal shield line P2 among the plurality of second signal lines T2. Furthermore, a width of a first dummy trace closest to a first signal shield line P1 among the plurality of first dummy traces DT1 equals that of the first signal shield line P1, and a width of a first dummy trace closest to a second signal shield line P2 among the plurality of first dummy traces DT1 equals that of the second signal shield line P2. Thereby, it is helpful to achieve uniformity of the overall distribution of the plurality of first dummy traces DT1, the first signal shield line P1, the second signal shield line P2 and the plurality of second signal lines T2, thereby facilitating the uniformity of etching for the metal film layer. It could be understood that "equal" or "same" mentioned herein is not limited to or in pursuit of equality or equivalence in an absolute sense, but instead it means to make the values of two parameters as close or equal as possible. For example, a difference between the pitch between adjacent first dummy traces DT1 and the pitch between a second signal shield line P2 and a second signal line T2 closest to the second signal shield line P2 may be within 5% of the pitch between adjacent first dummy traces DT1.

According to some embodiments of this disclosure, the touch electrode layer comprises a plurality of first touch electrodes arranged in parallel and a plurality of second touch electrodes arranged in parallel, the plurality of first touch electrodes and the plurality of second touch electrodes intersecting each other. Continuously referring to FIG. 3, the plurality of signal lines comprise a plurality of first signal lines T1 each connected with a corresponding first touch electrode and a plurality of second signal lines T2 each connected with a corresponding second touch electrode, and the second signal shield line P2 comprises a first segment P21 and a second segment P22. An extension pattern of the first segment P21 is consistent with an extension pattern of the outermost first signal line T1 away from the display area A among the plurality of first signal lines, and an extension pattern of the second segment P22 is consistent with an extension pattern of the outermost second signal line away from the display area among the plurality of second signal lines T2. Furthermore, in some embodiments, a pitch between the first segment P21 and the outermost first signal line equals that between the outermost first signal line and an adjacent first signal line, and a pitch between the second segment P22 and the outermost second signal line equals that between the outermost second signal line and an adjacent second signal line. Similarly, such arrangement of the second signal shield line is helpful for facilitating uniformity of the etching for the metal film layer. In the example of FIG. 3, the first segment P21 and the second segment P22 are separated from each other, and in other embodiments, the first segment P21 and the second segment P22 may be connected with each other to form an integrated second signal shield line.

Figure 5:
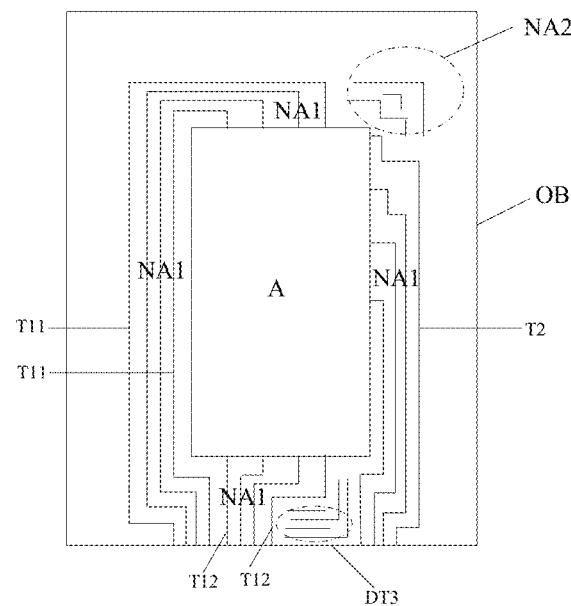
FIG. 5 schematically shows the distribution of the signal shield lines, the signal lines, the outer dummy traces and the middle dummy traces in the display panel according to yet another embodiment of this disclosure.

Although each touch electrode in the touch electrode layer is shown to be connected with only one signal line in the exemplary embodiments of FIG. 1 to FIG. 3, e.g., the signal line T1 in FIG. 3 may be connected with the transmitting electrode in the touch electrode layer, and the signal line T2 may be connected with the receiving electrode in the touch electrode layer, this does not constitute any limitation to the embodiments of this disclosure. In a further embodiment, each touch electrode may be connected with two signal lines. For example, as shown in FIG. 5, two ends (an upper end and a lower end) of each transmitting electrode in the touch electrode layer are connected with a signal line T11 and a signal line T12 respectively, and each receiving electrode is connected with the signal line T2. In other embodiments, each receiving electrode may be connected with two signal lines, or each transmitting electrode and each receiving electrode are both connected with two signal lines. To sum up, the layout of the touch electrodes in the touch electrode layer and signal lines and the connection between the touch electrodes and signal lines are not specifically limited at all in the embodiments of this disclosure, and the technical measure of improving the touch performance of the touch display device by means of dummy traces as disclosed in the embodiments of this disclosure is not limited by the connection between the touch electrodes and the signal lines.

Figure 6:
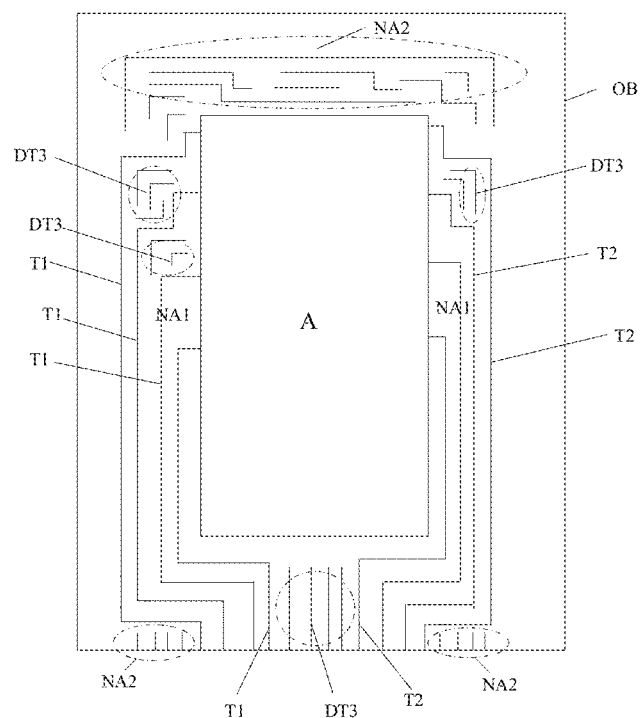
FIG. 6 schematically shows the distribution of the signal shield lines, the signal lines, the outer dummy traces and the middle dummy traces in the display panel according to still another embodiment of this disclosure.

According to some embodiments of this disclosure, the display panel further comprises at least one middle dummy trace located between the plurality of signal lines, the middle dummy traces and the plurality of signal lines being separated from each other. The middle dummy traces mentioned herein may be arranged between the plurality of first signal lines mentioned above, or between the plurality of second signal lines mentioned above, or between the first signal lines and the second signal lines mentioned above. Continuously referring to FIG. 5, a plurality of middle dummy traces DT3 are formed between the signal lines T2 and the signal lines T12. In other words, in case there is a large gap between the signal line T12 connected with the transmitting electrode and the signal line T2 connected with the receiving electrode, further dummy traces (i.e., the middle dummy traces DT3) may be formed therebetween. Likewise, the middle dummy traces may be arranged in gaps between other signal lines, e.g., the middle dummy traces may be formed in gaps between different signal lines connected with touch electrodes of a same type. As shown in FIG. 6, the middle dummy traces DT3 are shown to be probably present between the signal lines T1 connected with the transmitting electrode, between the signal lines T2 connected with the receiving electrode, and between the signal lines T1 and the signal lines T2. In other words, according to further embodiments of this disclosure, the middle dummy traces may be arranged between any two signal lines among the plurality of signal lines. The middle dummy traces DT3 can achieve a function at least partly similar to that of the first dummy traces DT1 and the second dummy traces DT2 in the above embodiments, i.e., it is possible to facilitate uniformity of the etching for the metal film layer during the fabrication of the signal lines, thereby helping to improve the touch performance of the touch display panel or display device. As mentioned above, according to some embodiments of this disclosure, the base substrate comprises a bending area located within the non-display area and forms a first part and a second part by the bending area, as shown in FIG. 3 and FIG. 4. The first part comprises the display area, and a middle non-display area of the non-display area located between the bending area and the display area (as shown in FIG. 3, the non-display area between the display area A and the bending area BA may be referred to as a middle non-display area), and the plurality of first signal lines and the plurality of second signal lines may extend to the bending area. As shown in FIG. 3, in some embodiments, the at least one middle dummy trace comprises at least one third dummy trace DT3 lying between the plurality of first signal lines T1 and the plurality of second signal lines T2 and located within the middle non-display area. The third dummy traces DT3 in this embodiment can achieve a function similar to that of the second dummy traces DT2 in the above embodiment, i.e., it is possible to facilitate uniformity of the etching for the metal film layer during the fabrication of the signal lines, the first signal shield line P1 and the second signal shield line P2, thereby helping to improve the touch performance of the touch display panel or display device. Besides, since the third dummy traces DT3 are close to the bending area BA, the third dummy traces DT3 can reduce the risk of the film layer in the vicinity of the bending area of the display panel coming off the base substrate, thereby improving the structural stability of the display panel. Furthermore, according to a further embodiment of this disclosure, materials of the second signal shield line may be arranged either between the plurality of first signal lines T1 and a third dummy trace DT3 adjacent thereto, or between the plurality of second signal lines T2 and a third dummy trace DT3 adjacent thereto. In other words, the second signal shield line may extend to both sides of the plurality of first signal lines T1 or the plurality of second signal lines T2 in the middle non-display area.

According to an embodiment of this disclosure, each of the signal line, the dummy trace and the signal shield line may comprise more than two metal wires which are electrically connected with each other but distributed in different layers so as to reduce the overall resistance thereof. In an example, the signal lines T1, T2 and the dummy traces DT1, DT2, DT3 each comprise a first metal wire and a second metal wire arranged above the first metal wire, and the display panel further comprises an insulating layer between the first metal wire and the second metal wire, the insulating layer having a via hole, and the first metal wire is electrically connected to the second metal wire through the via hole in the insulating layer.

Examples of the signal lines, the outer dummy traces, the first signal shield line and the second signal shield line in the embodiments of this disclosure will be further explained with reference to FIG. 7 to FIG. 11.

Figure 7:
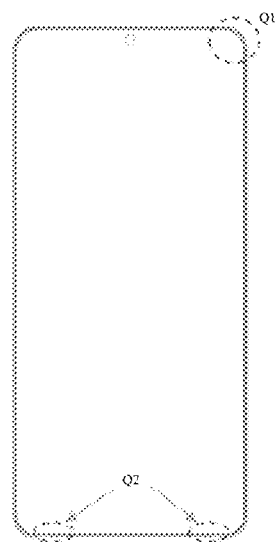
FIG. 7 schematically shows a general outline of regions where various lines around the display area of the display panel are located according to another embodiment of this disclosure.
Figure 8:
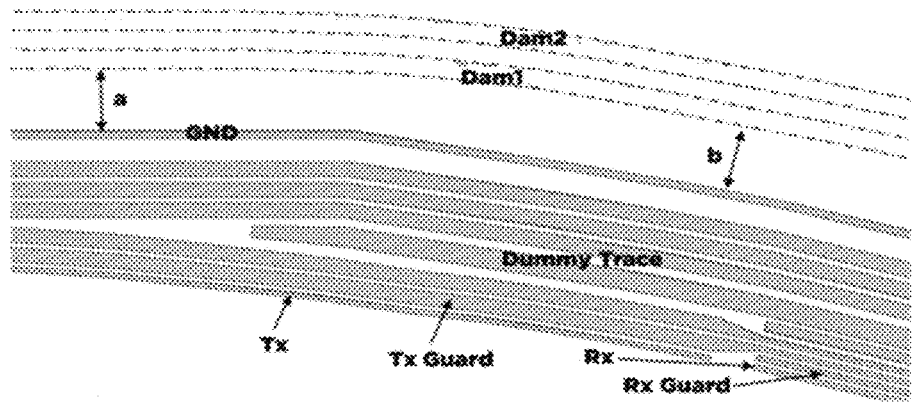
FIGS. 8-10 schematically show local enlarged views of an area indicated by Q1 in FIG. 7.

FIG. 7 shows a general outline of regions where various lines around the display area of the display panel are located. FIG. 8 is an enlarged view of an area indicated by Q1 in FIG. 7. As shown in FIG. 8, a first signal shield line P1 (which is a grounded wire GND in this example) is arranged outside the signal lines T1, T2, and two second signal shield lines P2 adjoin the first signal line T1 and the second signal line T2 respectively, so as to reduce or avoid external signal interference to the first signal line T1 and the second signal line T2. At least one outer dummy trace (indicated by "Dummy Trace" in FIG. 8) are arranged between the first signal shield line P1 and the second signal shield line P2. FIG. 8 further illustrates encapsulation dams Dam1, Dam2, and the encapsulation dams are also located within the non-display area and arranged to surround the display area, and the encapsulation dams may lie between the first signal shield line and an outer border of the non-display area. The example of FIG. 8 shows two encapsulation dams Dam1, Dam2, but in a further example, there can be one or more than two encapsulation dams. The encapsulation dams may have the same or different film layer structures. In an example, the encapsulation dam may comprise a protection layer and a barrier stacked sequentially. In another example, the encapsulation dam may further comprise a support above the barrier. At least one of the protection layer, the barrier and the support may be located in the same layer as a film layer in the display area of the display panel. For example, in an OLED display panel, the barrier of the encapsulation dam may be located in the same layer as a pixel definition layer.

According to some embodiments of this disclosure, the encapsulation dam extends within the non-display area around the first signal shield line, and a fixed first distance is maintained between the encapsulation dam and the first signal shield line, and a second distance is maintained between the first signal shield line and an outer dummy trace adjacent to the first signal shield line among the at least one outer dummy trace, a ratio of the first distance to the second distance being greater than 1 and smaller than six. For example, with reference to FIG. 8 in combination with FIG. 7, a distance a between the first signal shield line P1 and a region of the encapsulation dam Dam1 in a rounded corner on the upper right of the display panel equals a distance b between the first signal shield line P1 and a flat region of the encapsulation dam Dam1 on the top of the display panel. According to some embodiments of this disclosure, the first distance between the first signal shield line and the encapsulation dam is greater than the second distance between the first signal shield line and an outer dummy trace adjacent to the first signal shield line. In an example, the ratio of the first distance to the second distance may fall within the range of 1 to 6. As shown in FIG. 8, the distance a or b between the first signal shield line P1 and the encapsulation dam Dam1 may be 40 µm-170 µm, and a second distance d between the first signal shield line P1 and an outer dummy trace adjacent to the first signal shield line P1 may be 30 µm-40 µm. In a further example, the distance a or b between the first signal shield line P1 and the encapsulation dam Dam1 may be 75 µm-120 µm or 75 µm-130 µm.

According to some embodiments of this disclosure, a width of the first signal shield line P1 is greater than that of the second signal shield line P2. The width of the first signal shield line P1 may be three to five times the width of the second signal shield line P2. In the example of FIG. 8, the second signal shield line P2 has a width of 3 µm-5 µm, and the first signal shield line has a width of about 15 µm.

Figure 9:
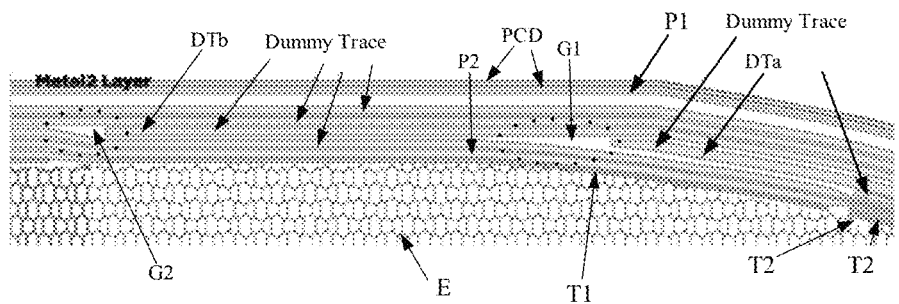

FIG. 9 not only shows a plurality of signal lines T1, T2, outer dummy traces Dummy Trace, first signal shield line P1 and second signal shield line P2, but also illustrates a touch electrode comprising a plurality of touch electrode blocks E. According to some embodiments of this disclosure, the touch electrode layer comprises a plurality of first touch electrodes arranged in parallel and a plurality of second touch electrodes arranged in parallel, the first touch electrodes and the second touch electrodes intersecting each other. Each first touch electrode and each second touch electrode may comprise a plurality of touch electrode blocks spaced apart from each other, and two touch electrode blocks adjacent to each other among the plurality of touch electrode blocks are connected with each other via a bridging layer. FIG. 9 illustrates a plurality of touch electrode blocks, a row or column of touch electrode blocks are electrically connected with each other via a bridging layer (not shown in FIG. 9) to form a first touch electrode or a second touch electrode. The first touch electrode or second touch electrode mentioned herein may be the aforementioned transmitting electrode or receiving electrode. As shown in FIG. 9, the first touch electrode and the second touch electrode formed by the touch electrode blocks E are connected with the first signal line T1 or the second signal line T2 respectively. In some embodiments, the touch electrode blocks E may be made of the same material and in the same process as the second metal wire. The layer in which the touch electrode blocks E and the second metal wire are located is identified as Metal2 Layer in FIG. 9.

According to some embodiments of this disclosure, the display panel further comprises at least one crack detection line arranged on the base substrate. In the example of FIG. 9, a crack detection line PCD is located between an outer border of the non-display area and the first signal shield line P1, and the crack detection line PCD may surround the first signal shield line P1, and an extension pattern thereof may be consistent with that of the first signal shield line P1. During the fabrication of the display panel, a mechanical process, such as cutting the base substrate may be involved, e.g., cutting a plurality of display panel units out of a fabricated motherboard, or cutting off unnecessary edge parts from the display panel. During the mechanical cutting, cracks may occur at the cut of the display panel or base substrate, and the crack detection line PCD may at least prevent the cracks from damaging the display panel, or in other words, with the crack detection line, the cracks may stop at the crack detection line instead of further extending towards the display area. In some embodiments, the crack detection line PCD may be fabricated in the same process as the touch electrode blocks E and the second metal wire, i.e., the layer in which the crack detection line is located is also identified as Metal2 Layer in FIG. 9.

According to some embodiments of this disclosure, a third distance between the crack detection line and the first signal shield line P1 is smaller than the second distance d (i.e., the second distance between the first signal shield line P1 and an outer dummy trace adjacent to the first signal shield line PD. In an example, the second distance between the first signal shield line P1 and an outer dummy trace adjacent to the first signal shield line P1 is two to three times the third distance. As mentioned above, the second distance d may be 30 μm-40 μm, and the third distance between the crack detection line PCD and the first signal shield line P1 is about 14 μm.

Furthermore, according to some embodiments of this disclosure, the display panel comprises two crack detection lines as shown in FIG. 9. The extension patterns of the two crack detection lines are identical and may be consistent with the extension pattern of the first signal shield line P1, and a pitch between the two crack detection lines is kept roughly constant. In some embodiments, each crack detection line may have a width of 4 μm, and two crack detection lines may keep a pitch of about 15 μm therebetween.

According to some embodiments of this disclosure, the base substrate comprises a rounded corner portion, and the second area comprises a curved region within the rounded corner portion and a flat region outside the rounded corner portion, and the curved region comprises a first gap and the flat region comprises a second gap. The first gap is formed jointly by an end of an outer dummy trace among the at least one outer dummy trace within the curved region and outer dummy traces adjacent to this outer dummy trace, and the second gap is formed jointly by an end of another outer dummy trace among the at least one outer dummy trace within the flat region and outer dummy traces adjacent to the another outer dummy trace, an area of the first gap being greater than that of the second gap.

Continuously referring to FIG. 7 and FIG. 9, some outer dummy traces among the at least one outer dummy trace in the non-display area may enclose small gaps which may be related to an end of a certain outer dummy trace or ends of certain outer dummy traces. FIG. 9 schematically shows gaps G1, G2 enclosed by ends of two outer dummy traces with other outer dummy traces respectively. The gaps G1, G2 schematically shown in FIG. 9 may correspond to the first gap and the second gap mentioned above. The first gap G1 is formed jointly by an end of an outer dummy trace DTa among the at least one outer dummy trace Dummy Trace within the curved region and outer dummy traces adjacent to the outer dummy trace DTa, and the second gap G2 is formed jointly by an end of another outer dummy trace DTb among the at least one outer dummy trace Dummy Trace within the flat region and outer dummy traces adjacent to the another outer dummy trace, an area of the first gap S1 being greater than that of the second gap G2. Gaps between the outer dummy traces such as the first gap and the second gap can effectively prevent or reduce effects of possible static electricity gathering at an end of an outer dummy trace on the other outer dummy traces. As shown in FIG. 9, the end of the first outer dummy trace DTa lying within the curved region is generally in a conical shape, such that the first gap G1 has a larger area, which facilitates the fabrication of the outer dummy traces in the curved region, and meanwhile prevents or reduces adverse effects of possible static electricity gathering at the end of the outer dummy trace.

Figure 10:
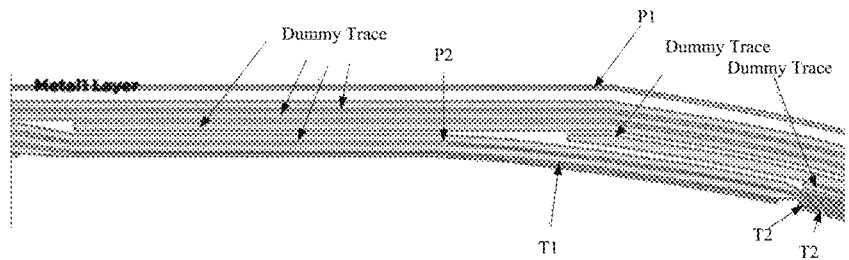

FIG. 10 shows the first metal wire mentioned in the above example, and the first metal wire may be located below the second metal wire, and in FIG. 10, the layer in which the first metal wire is located is identified as Metal1 Layer. The bridging layer (not shown in FIG. 10) may be made of the same material and in the same process as the first metal wire. As can be understood, FIG. 10 also indicates part of the wiring layout in the Metal2 Layer.

According to some embodiments of this disclosure, materials for fabricating the first metal wire and the second metal wire comprise at least one selected from a group consisting of titanium, silver and indium tin oxide. In an example, at least one of the first metal wire and the second metal wire comprises an aluminum layer and titanium layers located at both sides of the aluminum layer. Alternatively, at least one of the first metal wire and the second metal wire comprises a silver layer and indium tin oxide layers located at both sides of the silver layer. Therefore, the first metal wire may comprise a Ti/Al/Ti three-layer metal structure or an ITO/Ag/ITO three-layer metal structure. Likewise, the second metal wire may comprise a Ti/Al/Ti three-layer metal structure or an ITO/Ag/ITO three-layer metal structure.

Figure 11:
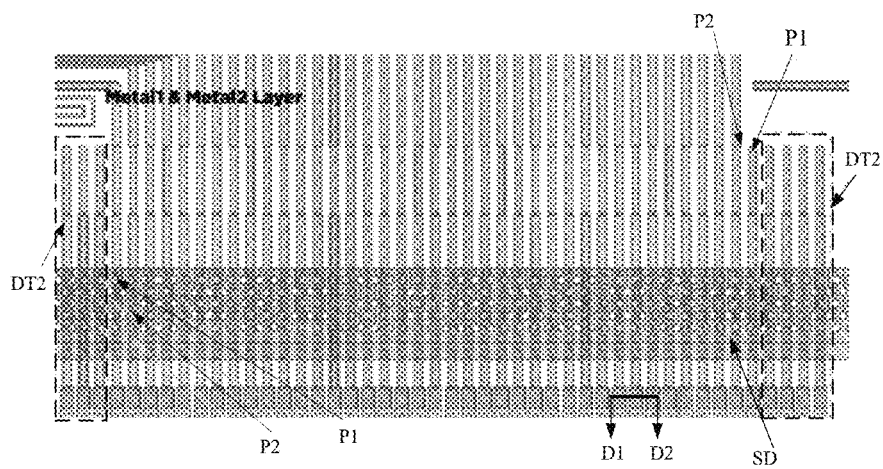
FIG. 11 schematically shows an enlarged view of areas indicated by Q2 in FIG. 7.

FIG. 11 shows a local enlarged view of the two areas Q2 of FIG. 7, i.e., FIG. 11 may be regarded as an enlarged view of the two areas Q2 of FIG. 7 after being combined. With reference to FIG. 7, FIG. 11 and FIG. 4, the non-display area shown in FIG. 11 is located in the first part 1A of the base substrate, and the bending area BA of the base substrate is not shown in FIG. 11. If the base substrate is in a flat state, the bending area may be located right below the region shown in FIG. 11. As shown in FIG. 11, at least one outer dummy trace DT2 (i.e., the second dummy traces mentioned in the above embodiments) are distributed within the second area and located at both sides of a plurality of signal lines and outside the first signal shield line P1 (e.g., the GND wire), as indicated by a rectangular dashed box in FIG. 11. As mentioned above, by adding the second dummy traces DT2 in the fabrication of the display panel, it is possible to facilitate uniformity of the etching for the metal film layer and helpful to improve the touch performance of the touch display panel or display device, and meanwhile, the second dummy traces DT2 are close to the bending area, which may further reduce the risk of film layers near the second dummy traces and in an adjacent area coming off the base substrate when the base substrate is being bent, thereby improving the structural stability of the display panel.

As mentioned above, in some embodiments of the disclosure, the wires including the signal lines comprise double-layer metal wires to reduce the resistance of the wires while facilitating the fabrication procedure of the wires and the touch electrode layer. In some embodiments, the first metal wires of the signal lines in different regions may be made of different materials, or the first metal wires of the signal lines in different regions may be fabricated in different processes. For example, for a bendable display panel, the base substrate forms a first part and a second part through the bending area, and the first part comprises a middle non-display area of the non-display area located between the bending area and the display area, and FIG. 11 may be regarded as an example of the local view of the middle non-display area. As shown in FIG. 11, SD may represent a structure located in the same layer as a source or a drain of a thin film transistor in the display area of the display panel but isolated therefrom, i.e., a source-drain signal line mentioned herein. In some embodiments, the source-drain signal line SD and part of the outer dummy traces (e.g., the second dummy traces DT2 shown in FIG. 11) at least have a partial overlapping area and are insulated from each other. Furthermore, the source-drain signal line SD and at least part of the signal lines may have a partial overlapping area and be insulated from each other.

According to a further embodiment of this disclosure, the display panel further comprises a transfer electrode for electrically connecting a pixel electrode (e.g., an anode of an organic light-emitting device of an OLED display panel) with a source or drain of a thin film transistor. In this case, SD in FIG. 11 may represent a structure located in the same layer as the transfer electrode and isolated therefrom, i.e., a transfer electrode signal line mentioned herein. In some embodiments, the transfer electrode signal line and at least part of the outer dummy traces at least have a partial overlapping area and are insulated from each other. Furthermore, the transfer electrode signal line and at least part of the signal lines at least have a partial overlapping area and are insulated from each other. In some embodiments, as shown in FIG. 11, the source-drain signal line SD or the transfer electrode signal line SD is further provided with a plurality of openings for releasing air in lower film layers. At least one opening of the plurality of openings and at least part of the outer dummy traces at least have a partial overlapping area. Furthermore, At least one opening of the plurality of openings and at least part of the signal lines at least have a partial overlapping area.

Figure 12:
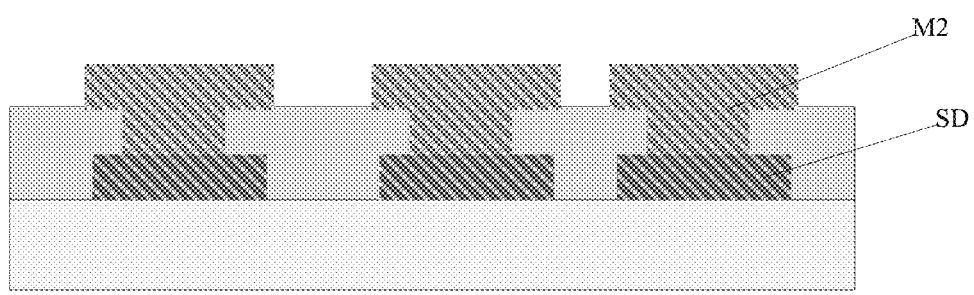
FIG. 12 schematically shows a local section view of FIG. 11 taken along line D1-D2.

According to some embodiments of this disclosure, in the bending area, at least a category of wires of the various wires including the signal lines may be implemented by means of other conductive structures of the display panel. For example, the display panel may comprise a pixel electrode and a thin film transistor for driving the pixels of the display panel to emit light, and the source-drain signal lines in a pixel driving circuit of the display panel formed in the same process as the source and drain of the thin film transistor may function as signal lines. With reference to FIG. 11 and FIG. 12, FIG. 12 schematically shows a section view of an area of the middle non-display area of FIG. 11 near the bending area taken along D1-D2, M2 represents a second metal wire, and SD represents a source-drain signal line serving as a first metal wire. According to some embodiments of this disclosure, within the bending area, the conductive structures of the display panel discussed above may be used as various wires mentioned above, so the second metal wire and the first metal wire may not extend to the bending area, and if the conductive structures extend into the second part in the bending area, for example, they may be electrically connected with the second metal wire in the second part. In other words, in the second part, various wires including signal lines may have a structure similar to that of the signal line in area Q1 of FIG. 7, i.e., comprising a first metal wire and a second metal wire electrically connected with each other.

As mentioned above, in some embodiments, the display panel further comprises a transfer electrode for electrically connecting the pixel electrode with the source or drain of the thin film transistor, and a transfer electrode signal line formed in the same process as the transfer electrode, and likewise, the transfer electrode signal line may be used as various lines in the bending area, so in an area of the middle non-display area near the bending area, the transfer electrode signal line is electrically connected with the second metal wire through a via hole penetrating the second insulating layer above the transfer electrode signal line, which may be schematically shown in FIG. 12. Within the bending area, the transfer electrode signal line may be used as various lines, and in this case, neither the second metal wire nor the first metal wire extends to the bending area. If the transfer electrode signal line extends into the second part in the bending area, for example, it may be electrically connected with the second metal wire in the second part. Similarly, in the second part, various lines including signal lines may have a structure similar to that of the signal line in area Q1 of FIG. 7, i.e., comprising a first metal wire and a second metal wire electrically connected with each other.

Figure 13:
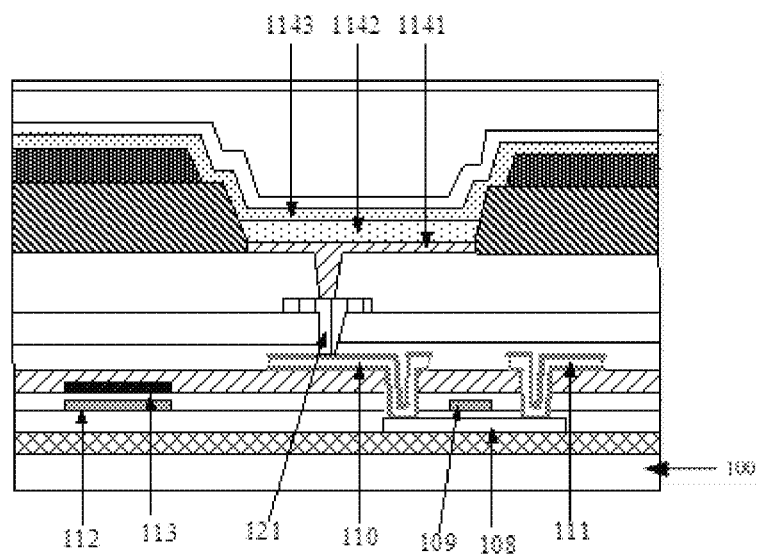
FIG. 13 schematically shows a local section view of a single pixel region of the display panel according to another embodiment of this disclosure.

FIG. 13 schematically shows a local section view of a display panel comprising a transfer electrode. As shown in FIG. 13, the display panel comprises a base substrate 100 and a pixel driving circuit and a light-emitting device over the base substrate. The pixel driving circuit may comprise a thin film transistor and a capacitor, the capacitor comprising a first capacitor electrode 112 and a second capacitor electrode 113, and the thin film transistor comprising an active layer 108, a gate 109, a source 110 and a drain 111. The light-emitting device comprises an anode 1141, a light-emitting functional layer 1142 and a cathode 1143. As shown in FIG. 13, the display panel further comprises a transfer electrode 121 between the source 110 and the anode 1141, and the transfer electrode 121 penetrates through an insulating layer to electrically connect a pixel electrode (e.g., the anode 1141) with the source 110. For the display panel shown in FIG. 13, the transfer electrode signal line may be formed during the fabrication of the transfer electrode 121, and the transfer electrode signal line may be used as a first metal wire within the middle non-display area. According to another embodiment of this disclosure, the display panel may comprise a pixel driving circuit, and the pixel driving circuit comprises a capacitor that includes capacitive electrodes, e.g., a first capacitive electrode 112 and a second capacitive electrode 113 in FIG. 13, and the display panel further comprises capacitive signal lines located within the non-display area and formed in the same fabrication process as the capacitive electrodes (e.g., the second capacitive electrode 113).

According to a further embodiment of this disclosure, the aforementioned conductive structures may comprise conductive structures or capacitive signal lines formed in the same layer as the gate, or a combination of the conductive structures mentioned above, e.g., the capacitive signal lines and the transfer electrode signal lines may be together used as signal lines of the bending area, or the transfer electrode signal lines may only function to provide electrical connection in an area close to the bending area of the middle non-display area, but are not used as signal lines. Various lines within the bending area including signal lines may be designed based on needs, which will not be limited herein. As mentioned above, the bending area is located below the region of line D1-D2, which will not be shown herein.

The "source-drain signal line", "transfer electrode signal line" and "capacitive signal line" mentioned herein refer to signal lines formed on the non-display area of the base substrate together with the source and the drain, the transfer electrode, the capacitive electrode respectively, rather than the source and the drain, the transfer electrode, or the capacitor per se, so they have the same materials as the source, the drain, the transfer electrode, or the capacitive electrode, but are not connected with the source and the drain, the transfer electrode, or the capacitive electrode.

Furthermore, according to a further embodiment of this disclosure, the first metal wire within the middle non-display area may comprise at least one of the transfer electrode signal line, the source-drain signal line and the capacitive signal line. In other words, any two or more of the transfer electrode signal line, the source-drain signal line and the capacitive signal line may function as the first metal wire at the same time. For example, the first metal wire within the middle non-display area may comprise a source-drain signal line and a transfer electrode signal line, or may comprise a transfer electrode signal line and a capacitive signal line.

In some embodiments, the width of each signal line T1, T2 extending from the touch controller to the touch electrode layer of the display area is not maintained constant, for example, the width of a portion of each signal line closer to the touch controller is smaller than that of a portion remoter from the touch controller, because the space for accommodating the signal lines in the vicinity of the touch controller is smaller than the space for accommodating the signal lines in an area remote from the touch controller. For example, the signal lines may be gradually broadened from the touch controller to the touch electrode layer, thereby reducing the overall resistance of the signal lines. In some embodiments, the widths of different signal lines among a plurality of signal lines may be different. For example, the signal lines may be arranged such that the remoter they are from the display area, the greater the width is. In other words, an average width of signal lines remoter from the display area is greater than an average width of signal lines closer to the display area among the plurality of signal lines. In this way, on one hand, the relatively abundant space at an area relatively remote from the display area can be sufficiently utilized to reduce the resistance of a single signal line, and on the other hand, this is beneficial for narrowing the difference in the overall resistance between different signal lines, because the greater average width of the outermost signal line away from the display area can compensate for the increased resistance of the signal line due to a longer extension length to a extent. In an example, the width of a portion of each signal line remote from the touch controller may vary between 3 μm and 50 μm. If the width of the signal line is too great, the effect of reducing the overall resistance of the signal line will be gradually decreased, and a greater capacitance will be easily formed between the signal line and other components (e.g., a cathode in an OLED display panel) of the display device, which is detrimental to the touch performance of the display device. For the embodiments of this disclosure, arranging a certain number of dummy traces facilitates uniform etching of the metal film layer during the fabrication of the signal lines and improves the touch performance of the touch display panel or display device, and meanwhile allows a reasonably greater width of the signal lines to minimize the resistance difference between different signal lines.

The display panel mentioned in the above embodiments may be a display panel of various types, including but not limited to, for example, an organic light-emitting diode (OLED) display panel, a liquid crystal display (LCD) panel and so on. In the case of an OLED display panel, the touch electrode layer may be fabricated above the light-emitting layer. In other words, the display panel further comprises a pixel structure layer between the touch electrode layer and the base substrate, and the pixel structure layer comprises an anode, a cathode and an organic light-emitting layer therebetween.

Another embodiment of the disclosure provides a display device, the display device comprising the display panel according to the above embodiments. The type or use of the display device is not limited at all in this disclosure, and the display device may be any electronic device or component having a display function, and examples of the display device comprise but are not limited to a mobile electronic device, a navigator, a watch, a printer, a computer, a PDA, a television or the like.

A further embodiment of this disclosure further provides a method for fabricating a display panel, and the method may comprise steps of: B1, providing a base substrate, the base substrate comprising a display area and a non-display area around the display area; B2, forming a touch electrode layer within the display area of the base substrate; B3, forming a plurality of signal lines within a first area of the non-display area adjacent to the display area, the plurality of signal lines being electrically connected with the touch electrode layer; B4, forming at least one outer dummy trace within a second area of the non-display area, the second area being between the first area and an outer border of the non-display area, and the at least one outer dummy trace and the plurality of signal lines being separated from each other.

Steps B1-B4 listed in the above embodiment do not mean that these steps must be completed sequentially or in different processes, but instead they only mean that the steps B1-B4 are involved in the method for fabricating a display panel according to this embodiment. For example, according to some embodiments of this disclosure, steps B2, B3 and B4 may be carried out in a same process, i.e., the touch electrode layer, the signal lines and the outer dummy traces may be fabricated during a same process.

As mentioned above, according to some embodiments of the disclosure, the touch electrode layer comprises a plurality of first touch electrodes arranged in parallel and a plurality of second touch electrodes arranged in parallel, the plurality of first touch electrodes and the plurality of second touch electrodes intersecting each other. The first touch electrode and the second touch electrode each comprise a plurality of touch electrode blocks spaced apart from each other, and every two touch electrode blocks adjacent to each other among the plurality of touch electrode blocks are connected with each other via a bridging layer, each signal line and each outer dummy trace comprise a first metal wire and a second metal wire electrically connected with each other. In this case, fabricating the touch electrode layer, the plurality of signal lines and the at least one outer dummy trace comprises: forming a first insulating layer on the base substrate; forming a first metal layer on the first insulating layer and patterning the first metal layer to form the bridging layer and the first metal wire; forming a patterned second insulating layer on the bridging layer and the first metal wire; fabricating a patterned second metal layer on the patterned second insulating layer to form the plurality of touch electrode blocks and the second metal wire, the second metal wire being connected to the first metal wire through a via hole in the patterned second insulating layer.

In an embodiment where the display panel further comprises a first signal shield line and a second signal shield line located within the non-display area, the method for fabricating a display panel further comprises: forming the first signal shield line and the second signal shield line during the fabrication of the plurality of signal lines and the at least one outer dummy trace based on the first metal layer and the second metal layer. That is, the first signal shield line, the second signal shield line, the outer dummy traces, the signal lines and the touch electrode layer may all be fabricated in a same process.

Furthermore, in a case where the display panel further comprises the middle dummy trace described in the above embodiments, the middle dummy traces may be formed at the same time when the outer dummy traces, the signal lines and the touch electrode layer are fabricated.

Figure 14:
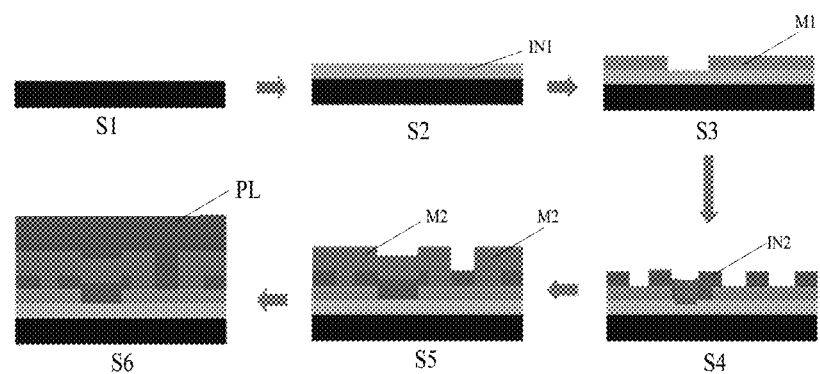
FIG. 14 schematically illustrates a process of fabricating the touch electrode layer in the display panel and various lines in the non-display area according to yet another embodiment of this disclosure.

According to some embodiments of this disclosure, at least one of the first signal shield line, the second signal shield line, the outer dummy traces, the signal lines and the middle dummy traces comprise a double-layer wiring (i.e., the first metal wire and the second metal wire). The procedure of fabricating the first signal shield line, the second signal shield line, the outer dummy traces and the signal lines will be generally explained with reference to the example of FIG. 14 for simplicity. As shown in FIG. 14, in step S1, a base substrate is provided, and some necessary components of a display panel may be fabricated on the base substrate, for example, for an OLED display panel, a pixel driving circuit and a pixel structure layer (e.g., including an anode, an organic light-emitting layer and a cathode) may be fabricated on the base substrate. In step S2, a first insulating layer IN1 is formed on the base substrate, and the material for forming the first insulating layer IN1 comprises but is not limited to SiNx. In step S3, a patterned first metal layer M1 is formed of a conductive material on the first insulating layer IN1, and the material of the first metal layer M1 comprises but is not limited to titanium, aluminum, silver, indium tin oxide, and any combination thereof. The pattern of the first metal layer M1 may comprise a pattern of the first metal wire and a pattern of the bridging layer in the above embodiments. In step S4, a second insulating layer IN2 is formed and then patterned such that some via holes exposing the first metal layer M1 are formed in the second insulating layer IN2. In step S5, a second metal layer M2 is formed on the patterned second insulating layer IN2, and the second metal layer M2 is then patterned. The pattern of the second metal layer M2 may comprise a pattern of the second metal wire and a pattern of the touch electrode blocks in the above embodiments. In step S6, a protection layer PL is formed on the patterned second metal layer M2, and the material of the protection layer PL comprises but is not limited to polyimide.

Some exemplary embodiments of this disclosure are specifically described above, but when practicing the disclosure sought for protection, those skilled in the art can understand and implement other variances of the disclosed embodiments based on study of the drawings, the description and the claims. In the claims, the wording "include" does not exclude the presence of other elements. Although some features are stated in different dependent claims, this application is also intended to cover embodiments combining these features.

The invention claimed is:

1. A display panel, comprising:
a base substrate, the base substrate comprising a display area and a non-display area around the display area;
a touch electrode layer on the base substrate, the touch electrode layer being within the display area; and
a plurality of signal lines electrically connected with the touch electrode layer, the plurality of signal lines being distributed within a first area of the non-display area,
wherein the display panel further comprises at least one outer dummy trace located within a second area of the non-display area, the second area being between the first area and an outer border of the non-display area,
wherein the at least one outer dummy trace and the plurality of signal lines are separated from each other,
wherein the display panel further comprises a first signal shield line and a second signal shield line within the non-display area, at least part of the first signal shield line is between the second area and the outer border of the non-display area, and the second signal shield line is between the first signal shield line and the first area, and
wherein the at least one outer dummy trace comprises at least one first dummy trace located between the first signal shield line and the second signal shield line.

2. The display panel according to claim 1, wherein the first signal shield line comprises a grounded wire, and the second signal shield line is configured to receive a fixed potential or a square wave signal.

3. The display panel according to claim 1, wherein the touch electrode layer comprises a plurality of first touch electrodes arranged in parallel and a plurality of second touch electrodes arranged in parallel, the plurality of first touch electrodes and the plurality of second touch electrodes intersect each other, and
wherein the plurality of signal lines comprise a plurality of first signal lines each connected with a corresponding first touch electrode and a plurality of second signal lines each connected with a corresponding second touch electrode.

4. The display panel according to claim 1, wherein the base substrate comprises a bending area within the non-display area, and the base substrate forms a first part and a second part via the bending area,
wherein the first part comprises the display area, the first area and the second area, and
wherein the at least one outer dummy trace further comprises at least one second dummy trace located within the second area and adjacent to the bending area.

5. The display panel according to claim 4, wherein the plurality of signal lines, the first signal shield line and the second signal shield line extend to the bending area, and the at least one second dummy trace is distributed between the first signal shield line and the outer border of the non-display area.

6. The display panel according to claim 1, wherein the display panel further comprises at least one middle dummy trace between at least part of the plurality of signal lines, the at least one middle dummy trace and the plurality of signal lines are separated from each other.

7. The display panel according to claim 6, wherein the touch electrode layer comprises a plurality of first touch electrodes arranged in parallel and a plurality of second touch electrodes arranged in parallel, the plurality of first touch electrodes and the plurality of second touch electrodes intersect each other,
wherein the plurality of signal lines comprise a plurality of first signal lines each connected with a corresponding first touch electrode and a plurality of second signal lines each connected with a corresponding second touch electrode,
wherein the base substrate comprises a bending area within the non-display area, and the base substrate forms a first part and a second part via the bending area, wherein the first part comprises the display area and a middle non-display area of the non-display area between the bending area and the display area, and
wherein the plurality of first signal lines and the plurality of second signal lines extend to the middle non-display area, and the at least one middle dummy trace comprises at least one third dummy trace located between the plurality of first signal lines and the plurality of second signal lines and within the middle non-display area.

8. The display panel according to claim 4, wherein the display panel further comprises a touch controller arranged on the second part of the base substrate, and the plurality of signal lines are electrically connected to the touch controller.

9. The display panel according to claim 5, wherein the at least one first dummy trace is spaced apart and distributed evenly between the first signal shield line and the second signal shield line, and the at least one second dummy trace is spaced apart and distributed evenly between the first signal shield line and the outer border of the non-display area.

10. The display panel according to claim 7, wherein at least one of the outer dummy trace, at least one of the plurality of the signal lines and the middle dummy trace comprises a first metal wire and a second metal wire above the first metal wire, and the display panel further comprises an insulating layer between the first metal wire and the second metal wire, the insulating layer comprises a via hole, and the first metal wire is electrically connected to the second metal wire through the via hole in the insulating layer.

11. The display panel according to claim 10, wherein a material of the first metal wire and the second metal wire comprises at least one selected from a group consisting of titanium, silver and indium tin oxide.

12. The display panel according to claim 1, wherein the display panel further comprises an encapsulation dam on the base substrate, the encapsulation dam is between the first signal shield line and the outer border of the non-display area, wherein the encapsulation dam extends within the non-display area around the first signal shield line, and a first distance is maintained between the encapsulation dam and the first signal shield line, and a second distance is maintained between the first signal shield line and an outer dummy trace adjacent to the first signal shield line among the at least one outer dummy trace, and wherein a ratio of the first distance to the second distance is greater than 1 and smaller than 6.

13. The display panel according to claim 1, wherein an average width of signal lines remoter from the display area is greater than an average width of signal lines closer to the display area among the plurality of signal lines.

14. The display panel according to claim 1, wherein the display panel further comprises at least one crack detection line on the base substrate, the at least one crack detection line is between the outer border of the non-display area and the first signal shield line, and an extension pattern of the at least one crack detection line is consistent with an extension pattern of the first signal shield line.

15. The display panel according to claim 14, wherein a third distance is maintained between the at least one crack detection line and the first signal shield line, and wherein a second distance between the first signal shield line and an outer dummy trace adjacent to the first signal shield line among the at least one outer dummy trace is two to three times the third distance.

16. The display panel according to claim 1, wherein the display panel further comprises a pixel structure layer between the touch electrode layer and the base substrate, and the pixel structure layer comprises an anode, a cathode and an organic light-emitting layer therebetween.

17. A display device, comprising the display panel according to claim 1.

* * * * *